United States Patent
Jiang et al.

(10) Patent No.: US 9,691,836 B2
(45) Date of Patent: Jun. 27, 2017

(54) PIXEL UNIT, ARRAY SUBSTRATE, DISPLAY DEVICE AND METHOD FOR MANUFACTURING THE SAME INCLUDING MOW/CU/MOW CONDUCTIVE LINE

(71) Applicant: BOE TECHNOLOGY GROUP CO., LTD., Beijing (CN)

(72) Inventors: Chunsheng Jiang, Beijing (CN); Jingfei Fang, Beijing (CN); Baojiang Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 14/769,456

(22) PCT Filed: Dec. 25, 2014

(86) PCT No.: PCT/CN2014/094970
§ 371 (c)(1),
(2) Date: Aug. 21, 2015

(87) PCT Pub. No.: WO2016/041285
PCT Pub. Date: Mar. 24, 2016

(65) Prior Publication Data
US 2016/0254339 A1     Sep. 1, 2016

(30) Foreign Application Priority Data

Sep. 18, 2014  (CN) .......................... 2014 1 0478300

(51) Int. Cl.
*H01L 29/08* (2006.01)
*H01L 27/32* (2006.01)
(Continued)

(52) U.S. Cl.
CPC ........ *H01L 27/3274* (2013.01); *H01L 27/124* (2013.01); *H01L 27/3276* (2013.01);
(Continued)

(58) Field of Classification Search
CPC ............... H01L 27/3274; H01L 27/124; H01L 27/3276; H01L 29/4908; H01L 51/56
See application file for complete search history.

(56) References Cited

U.S. PATENT DOCUMENTS

2004/0164297 A1  8/2004  Kaneko et al.
2007/0272926 A1* 11/2007  Deng .................. H01L 27/1214
                                                    257/59

FOREIGN PATENT DOCUMENTS

CN     1885511 A     12/2006
CN   101060124 A     10/2007
(Continued)

OTHER PUBLICATIONS

First Chinese Office Action, of Chinese Patent Application No. 2014104783000, dated Nov. 4, 2016, 11 pages.
(Continued)

*Primary Examiner* — Matthew Gordon
(74) *Attorney, Agent, or Firm* — Kinney & Lange, P.A.

(57) ABSTRACT

A pixel unit is used in an array substrate of a display device. In one embodiment, it comprises a gate line, a source-drain line and a thin-film transistor; and the gate line is in an overlapped structure comprising a first MoW layer, a Cu layer and a second MoW layer overlapped successively; and a gate of the thin-film transistor is formed of the first MoW layer. In another embodiment, the source-drain line is in a same overlapped structure; and a source and a drain of the thin-film transistor are formed of the first MoW layer. The first embodiment is achieved by means of a halftone process while the second embodiment is achieved by means of a lift off process. Diffusion of Cu in the gate layer or in the source-drain layer towards the oxide active layer is prevented. Also disclosed is a method for manufacturing the abovementioned pixel unit, an array substrate comprising the abovementioned pixel unit, a display device comprising
(Continued)

the abovementioned pixel unit, and a method for manufacturing abovementioned array substrate and display device.

19 Claims, 6 Drawing Sheets

(51) Int. Cl.
    *H01L 51/56*     (2006.01)
    *H01L 29/49*     (2006.01)
    *H01L 27/12*     (2006.01)

(52) U.S. Cl.
    CPC .......... *H01L 29/4908* (2013.01); *H01L 51/56* (2013.01); *H01L 27/3262* (2013.01)

(56) References Cited

FOREIGN PATENT DOCUMENTS

| CN | 103811327 A | 5/2014 |
|---|---|---|
| KR | 20080004989 A | 1/2008 |

OTHER PUBLICATIONS

International Search Report and Written Opinion from PCT Application Serial No. PCT/CN2014/094970, dated Jun. 12, 2015, 11 pages.

\* cited by examiner

PIXEL UNIT, ARRAY SUBSTRATE, DISPLAY DEVICE AND METHOD FOR MANUFACTURING THE SAME INCLUDING MOW/CU/MOW CONDUCTIVE LINE

BACKGROUND

Technical Field

Embodiments of the present invention relate to the field of display technologies, and particularly, to a pixel unit used in an array substrate of a display device and a method for manufacturing the same, an array substrate comprising the pixel unit, and a display device and a method for manufacturing the same. Embodiments of the present invention are specifically suitable to these pixel units, array substrates and display devices including a thin-film transistor (TFT) which comprises an active layer made of oxide.

Description of the Related Art

Organic Light-Emitting Diode (OLED) has advantages of active luminescence, high luminescent efficiency, fast response time (at a magnitude of 1 μs), low working voltage (of 3~10V), wide viewing angle (of greater than 170°), thin panel thickness (of less than 2 mm), low power consumption, broad working temperature range (of −4° C.~85° C.), flexible displaying and the likes. Accordingly, it becomes a third generation display technology after CRT and LCD.

Production processes such as small molecule evaporation, polymer spin coating, inkjet printing, large-area printing may be adopted in the manufacture of OLED, which have relatively low manufacturing cost and are suitable to mass production. This makes OLED more and more competitive with fluorescent lamps in the long run. Relative to point light source of LED, White Organic Light-Emitting Diode (WOLED), belonging to surface light source, can be used to manufacture flat plate light source and is more suitable for backlight source of liquid crystal display device and full color OLED display device. WOLED has great potential on application of flat plate lightings, accordingly, WOLED becomes hot topic of development over the past 10 years and is expected to be a leading role in new generation semiconductor lighting as the LED does.

Nowadays, in order to achieve manufacture of OLED array substrate with large-scale in area and high in resolution ratio, bottom-gate 7-Mask (7 times of patterning, that is, the mask is used 7 times) process is used in prior art.

FIGS. 1A and 1B show flow diagrams of a conventional method for manufacturing a bottom-gate type thin-film transistor of an OLED array substrate, in which FIG. 1A shows former four patterning processes and FIG. 1B shows later three patterning processes.

Each pixel unit used in the OLED array substrate comprises two thin-film transistors (i.e., Switching TFT and Driving TFT), and a drain of the switching TFT is electrically connected with a gate of the driving TFT.

Referring to FIG. 1A, the abovementioned processes comprise the following steps.

Step S11 of forming a gate 102 of a switching TFT and a gate 102' of a driving TFT on a substrate 101, and depositing a Gate Insulating Layer (FIL) 103 over the gate 102 of the switching TFT and the gate 102' of the driving TFT.

Procedure of forming the gate 102 of the switching TFT and the gate 102' of the driving TFT comprises: forming a gate layer thin film, and forming a pattern including the gate 102 and the gate 102' by means of one patterning process (1st Mask).

Step S12 of forming an active layer 104 over the gate insulating layer 103.

Material for the active layer can be Indium Gallium Zinc Oxide (IGZO). Procedure of forming the active layer 104 comprises: forming an active layer thin film, and, forming a pattern including the acting layer by means of one patterning process (2nd Mask).

Step S13 of forming an Etch Stop Layer (ESL) 105 over the active layer 104.

Procedure of forming the etch stop layer 105 over the active layer 104 comprises: forming a pattern including the etch stop layer 105 by means of one patterning process (3rd Mask).

Step S14 of forming an opening, for connection between a gate 102' of the driving TFT and a drain of a switching TFT to be formed later, on the gate insulating layer 103 above the gate of the driving TFT.

Procedure of forming the opening comprises: forming a gate insulating layer pattern including the opening by means of one patterning process (4th Mask).

Referring to FIG. 1B, next is step S15 of forming a source 1061 and a drain 1062 on the substrate after the preceding steps.

Procedure of forming the source 1061 and the drain 1062 comprises: forming a source-drain thin film, and, forming a pattern including the source 1061 and the drain 1062 by means of one patterning process (5th Mask).

Step S16 of depositing a protective layer (PVX or passivation layer) 107, and forming an opening, for connection between a gate 102' of the driving TFT and a drain 1062 of the switching TFT, on the protective layer 107 above the drain 1062 of the switching TFT and the gate of the driving TFT.

Procedure of forming the opening comprises: forming a protective layer pattern including the opening by means of one patterning process (6th Mask).

Step S17 of forming a conductive pattern 108 over the protective layer 107. Material for the conductive pattern can be Indium Tin Oxide (ITO).

Procedure of forming the conductive pattern 108 comprises: forming a transparent conductive film thin film, and, forming a pattern including the conductive pattern 108 by means of one patterning process (7th Mask).

Concerning the above manufacturing method, the manufacture of TFT requires 7 times of patterning processes (7-mask), which is complicated in process flow.

Nowadays, Active Matrix Organic Light Emitting Diode (AMOLED) with large-scale size, high resolution ratio, high refresh rate and 3D form is considered as a trend of future development. It employs low-resistivity wiring technology and high mobility TFT. Cu+Oxide (Copper Gate and Oxide Active Layer) technology is very competitive if it fulfills above mentioned requirements. However, Cu itself has very high diffusion coefficient, and, Cu element will diffuse towards the active layer during use of the TFT, which deteriorates semiconductor performance of the TFT and increases the drain current.

SUMMARY

Embodiments of the present invention provide a pixel unit used in an array substrate of a display device, the pixel unit comprising a gate line, a source-drain line and a thin-film transistor, wherein, the gate line is in an overlapped structure comprising a first MoW layer, a Cu layer and a second MoW layer overlapped successively; and a gate of the thin-film transistor is formed of the first MoW layer.

Embodiments of the present invention provide a method of manufacturing the abovementioned pixel unit. The method comprises steps of: S1. forming a first MoW layer, a Cu layer and a second MoW layer successively on a substrate, to form the overlapped structure; S2. coating photoresists onto a region for the gate line and a region for the thin-film transistor over the overlapped structure, respectively, and, performing a halftone process so that a thickness of the photoresist on the region for the gate line is greater than a thickness of the photoresist on the region for the thin-film transistor; S3, etching regions of the overlapped structure where no photoresist is coated, to remove all the regions of the overlapped structure where no photoresist is coated; S4, etching the photoresists, so that the photoresist over the region for the thin-film transistor is completely etched off, to expose the overlapped structure, while the photoresist over the region for the gate line is not completely etched off; S5, etching the exposed overlapped structure obtained in the step S4, to remove the second MoW layer and the Cu layer of the exposed overlapped structure so as to expose the first MoW layer; and, S6, manufacturing the thin-film transistor where the exposed first MoW layer obtained in the step S5 is served as the gate layer.

Embodiments of the present invention further provide a pixel unit used in an array substrate of a display device, the pixel unit comprising a gate line, a thin-film transistor and a source-drain line connected to a source and a drain of the thin-film transistor, wherein, the source-drain line is in an overlapped structure comprising a first MoW layer, a Cu layer and a second MoW layer overlapped successively; and the source and the drain of the thin-film transistor are formed of the first MoW layer.

Embodiments of the present invention further provide a method for manufacturing a pixel unit, wherein, the method comprises steps of: T1, forming a gate layer including the gate line and a gate of the thin-film transistor, a gate stop layer, an active layer and an etching stop layer on a substrate successively; T2, forming a first MoW layer over a region for the source-drain line and a region for the source and the drain of the thin-film transistor; T3, coating photoresists onto regions, other than the region for the source-drain line, to form photoresist regions; T4, forming a Cu layer and a second MoW layer over the photoresist regions and the region for the source-drain line successively; T5, removing the photoresists as well as the Cu layer and the second MoW layer formed thereover, by means of a lift off process, to expose the first MoW layer in the region for the source-drain of the thin-film transistor; and, T6, manufacturing the thin-film transistor where the exposed first MoW layer obtained in the step T5 is served as the source and the drain.

Embodiments of the present invention further provide a method for manufacturing an array substrate, wherein, a pixel unit of the array substrate is manufactured by a method for manufacturing the abovementioned pixel unit.

Embodiments of the present invention further provide a method for manufacturing a display device, wherein an array substrate of the display device is manufactured by the abovementioned method for manufacturing the array substrate.

BRIEF DESCRIPTION OF THE DRAWINGS

In order to clearly describe technical solutions of the embodiments of the present invention, the drawings used in the embodiments will be introduced briefly hereinafter. Obviously, the technical solutions illustrated in these drawings are only some exemplary embodiments of the present invention. For those skilled in the art, other drawings may be achieved by referring to the following drawings without involving any inventive steps.

DETAILED DESCRIPTION OF THE EMBODIMENTS

Figure 1A:
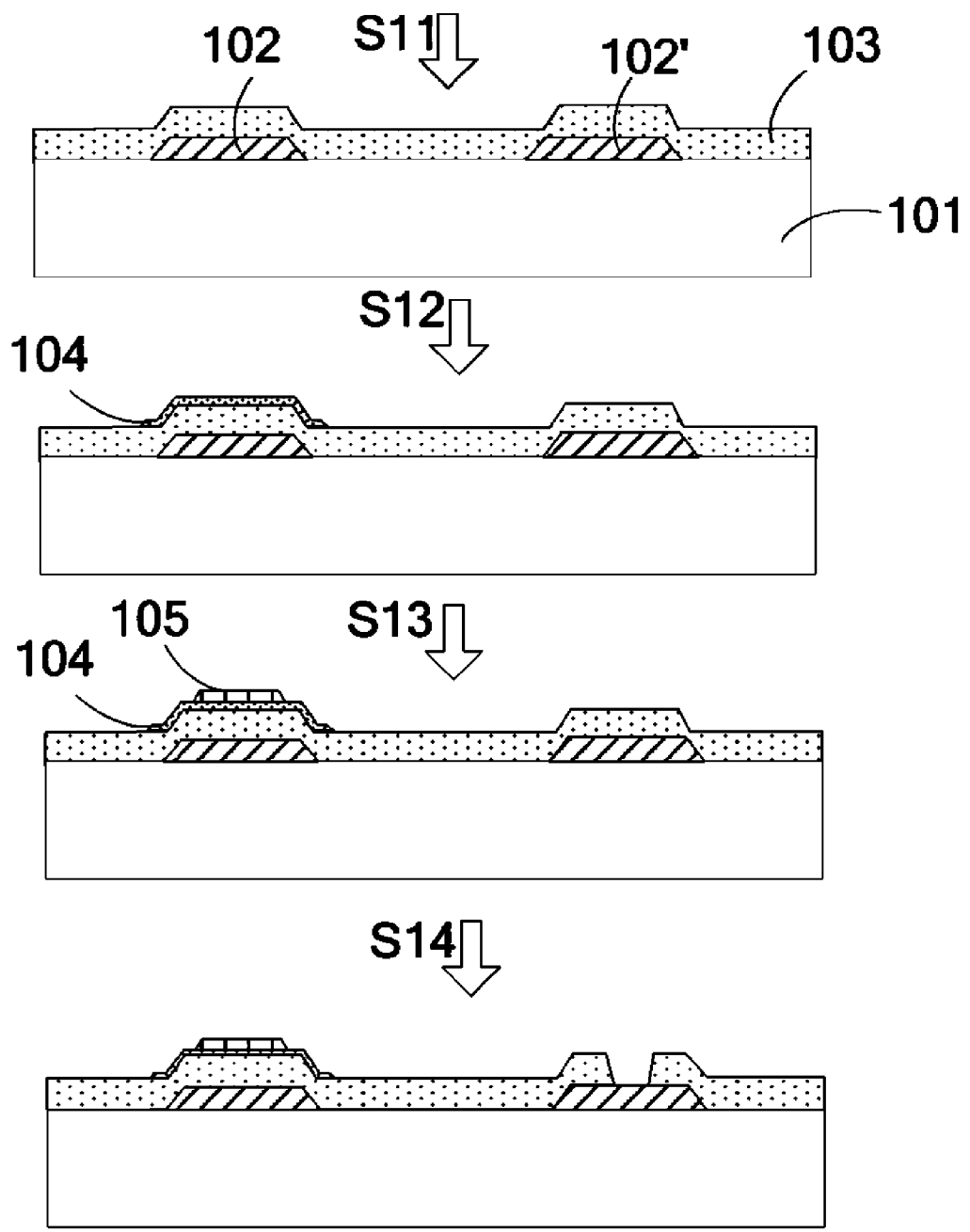
FIGS. 1A and 1B are schematic flow diagrams of a conventional method for manufacturing a bottom-gate type thin-film transistor of an OLED array substrate.
Figure 1B:
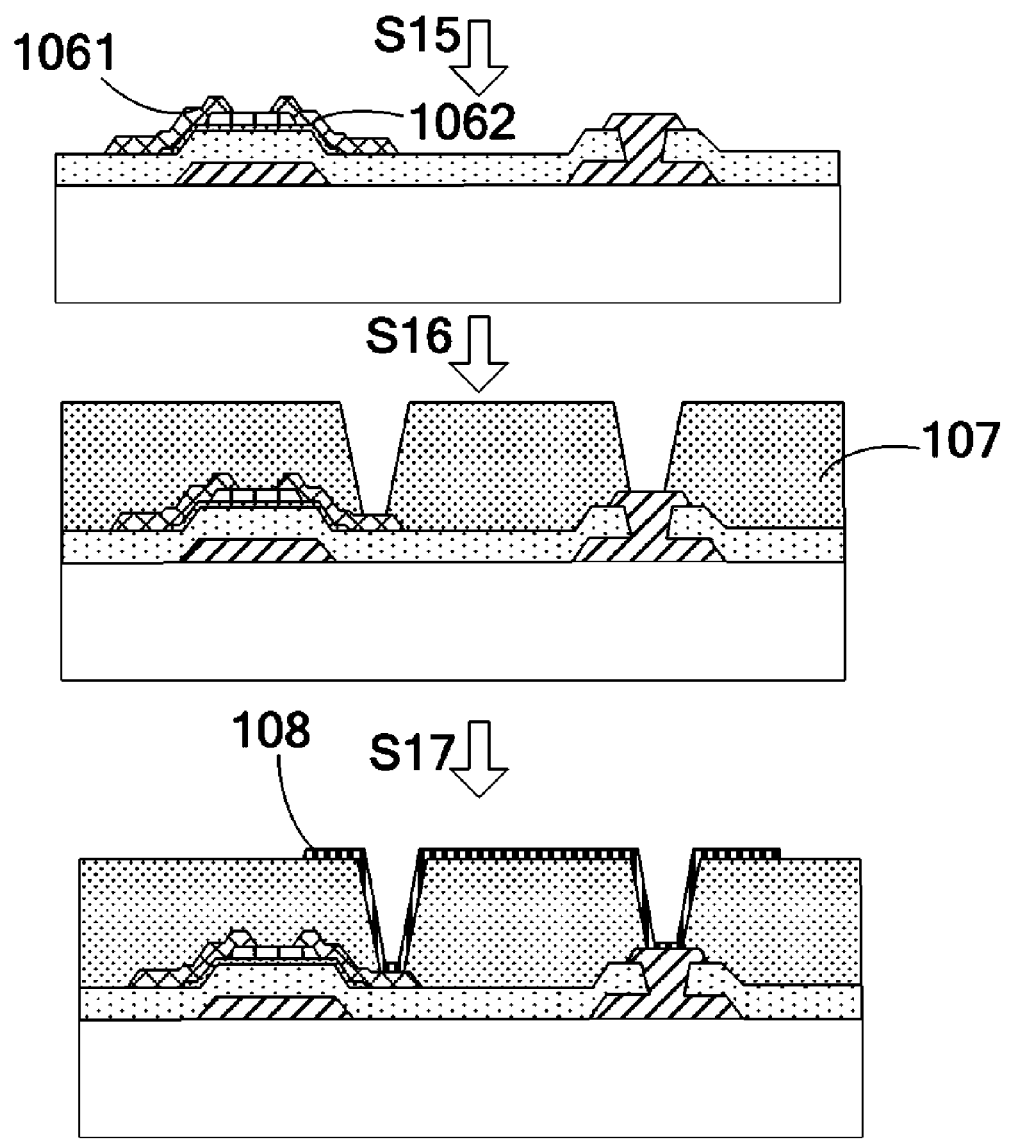

In order to provide a more clear understanding of objects, technique solutions and advantages of embodiments of the present invention, the present invention will be further described hereinafter in detail in conjunction with these embodiments and with reference to the attached drawings.

In addition, for purpose of explanations, lots of details are presented in the following description in order to provide a complete understanding of these disclosed embodiments. However, it should be understood that one or more embodiments can be implemented without these details. In other cases, well-known structures and devices are simplified for clear purposes.

As mentioned above, in the manufacture of the array substrate of the display device, when a MoW/Cu/MoW overlapped structure is used as materials for gate or source-drain of the TFT, diffusion of Cu layer towards the active layer of the TFT needs to be prevented. Accordingly, one of the MoW layers and the Cu layer in-between of materials for gate or source-drain are removed while only one of the MoW layers is remained served as materials for gate and/or source-drain of the TFT.

According to one aspect of embodiments of the present invention, there provides a pixel unit comprising a gate line, a source-drain line and a thin-film transistor (TFT). The gate line is in an overlapped structure comprising a first MoW layer, a Cu layer and a second MoW layer overlapped successively; and, a gate of the thin-film transistor is formed of the first MoW layer.

As mentioned above, in the abovementioned pixel unit, an active layer of the TFT may be oxide. Problem of diffusion of Cu towards the active layer is naturally eliminated since no Cu is included in the gate of the TFT.

As to the abovementioned pixel unit, embodiments of the present invention provide a method of manufacturing a pixel unit. The method comprises: first of all, forming a first MoW layer, a Cu layer and a second MoW layer successively on a substrate, to form the overlapped structure; then, coating photoresists onto a region for the gate line and a region for the thin-film transistor over the overlapped structure, respectively, and, performing a halftone process so that a thickness of the photoresist on the region for the gate line is greater than a thickness of the photoresist on the region for the thin-film transistor; after that, etching regions of the overlapped structure where no photoresist is coated, to remove all the regions of the overlapped structure where no photoresist is coated x.

Then, etching the photoresists so that the photoresist over the region for the thin-film transistor is completely etched off, to expose the overlapped structure while the photoresist over the region for the gate line is not completely etched off. After that, etching the exposed overlapped structure obtained in the above step, to remove the second MoW layer and the Cu layer of the exposed overlapped structure so as to expose the first MoW layer. Finally, manufacturing the thin-film transistor where the exposed first MoW layer is served as the gate layer.

According to another aspect of embodiments of the present invention, there is provided a pixel unit comprising a gate line, a thin-film transistor and a source-drain line connected to a source and a drain of the thin-film transistor. The source-drain line is in an overlapped structure comprising a first MoW layer, a Cu layer and a second MoW layer overlapped successively; and, the source and the drain of the thin-film transistor are formed of the first MoW layer.

As mentioned above, in the abovementioned pixel unit, an active layer of the TFT may be oxide. Problem of diffusion of Cu towards the active layer is naturally eliminated since no Cu is included in the source and the drain of the TFT. The source-drain line comprises at least one of a data line and a VDD line.

A method for manufacturing the above pixel unit comprises steps of: first of all, forming a gate layer including the gate line and a gate of the thin-film transistor, a gate stop layer, an active layer and an etching stop layer on a substrate successively; then, forming a first MoW layer over a region for the source-drain line and a region for the source and the drain of the thin-film transistor; coating photoresists onto regions, other than the region for the source-drain line, to form photoresist regions; and, forming a Cu layer and a second MoW layer over the photoresist regions and the region for the source-drain line successively.

After that, removing the photoresists as well as the Cu layer and the second MoW layer formed thereover, by means of a lift off process, to expose the first MoW layer in the region for the source-drain of the thin-film transistor; and, manufacturing the thin-film transistor where the exposed first MoW layer is served as the source and the drain.

Embodiments of the present invention further disclose an array substrate and a display device comprising the above pixel unit and methods for manufacturing the same.

In order to provide a more clear understanding of objects, technique solutions and advantages of embodiments of the present invention, the present invention will be further described hereinafter in detail in conjunction with these embodiments and with reference to the attached drawings.

First Embodiment

Figure 2:
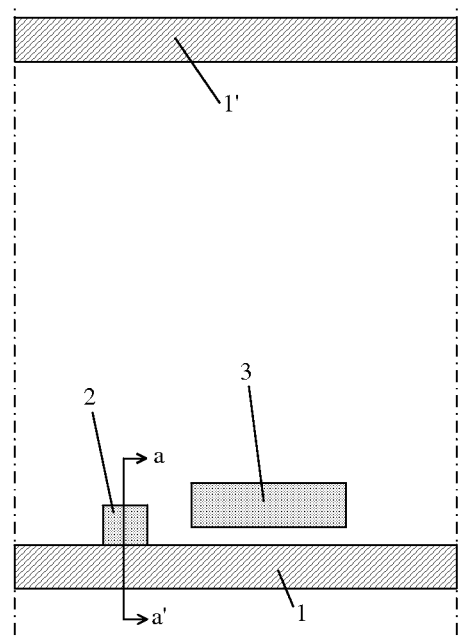
FIG. 2 is a top view of a pixel unit according to a first embodiment of the present invention, after a gate line and a gate of a TFT are formed.

FIG. 2 is a top view of a pixel unit according to a first embodiment of the present invention, after a gate line and a gate of a TFT are formed. Referring to FIG. 2, regions 1, 1' for gate line are shown as shadow slash regions, while region for one pixel unit is shown as a region enclosed by the regions 1, 1' for gate line and dotted lines. In this view, regions 2, 3 for gate of the TFT are shown. The TFT includes a region 2 where a gate switching TFT is located and a region 3 where a data driving TFT is located.

In this embodiment, material for gate line formed on the region for gate line is in an overlapped structure comprising a first MoW layer, a Cu layer and a second MoW layer from bottom to top. And, a gate formed on the region for the gate of the thin-film transistor is formed of the first MoW layer.

Figure 3:
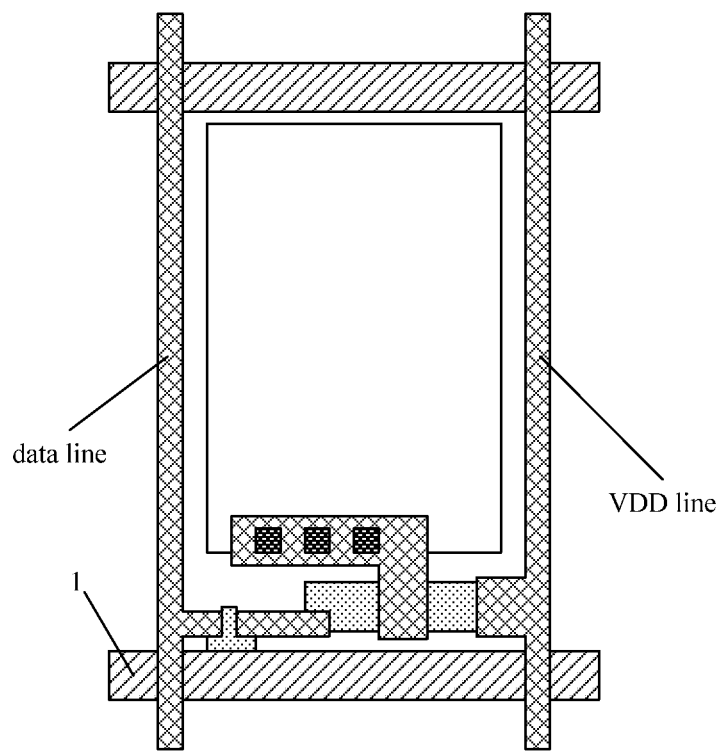
FIG. 3 is a top view of the embodiment shown in FIG. 2, after a source-drain line is formed.

Then, the pixel unit shown in FIG. 2 is formed with an active layer and a source-drain line, such that manufacture of whole pixel unit is completed. FIG. 3 is a top view of the above embodiment, after a source-drain line is formed. Referring to FIG. 3, the source-drain line comprises a data line and a VDD line. The date line is used for providing data driving, while the VDD line is used for providing current source line of light to OLED.

As to the pixel unit shown in FIG. 2, its formation process will be described with reference to FIG. 4A to FIG. 4D. FIG. 4A to FIG. 4D are schematic diagrams showing a manufacturing process, step by step, along line a-a' in FIG. 2. The process comprises the following steps.

S1. forming a first MoW layer, a Cu layer and a second MoW layer successively on a substrate, to form the overlapped structure.

Figure 4A:
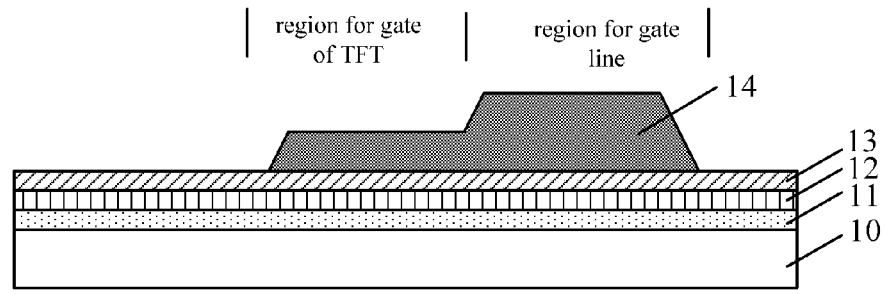
FIG. 4A to FIG. 4D are schematic diagrams showing a manufacturing process, step by step, along line a-a' in FIG. 2.

Referring to FIG. 4A, first of all, the first MoW layer 11, the Cu layer 12 and the second MoW layer 13 are formed from bottom to top successively on the substrate 10, to form the overlapped structure. The substrate in this embodiment is a glass substrate, however, substrates made of other materials, e.g., flexible PI substrate and the likes, may be used in embodiments of the present invention. The first MoW layer 11 and the second MoW layer 13 may be formed by sputtering. Thickness of the first MoW layer should be controlled within 00~300 A, while thickness of the second MoW layer should be controlled within 300~500 A.

S2. coating photoresists onto a region for the gate line and a region for the thin-film transistor over the overlapped structure, respectively, and, performing a halftone process so that a thickness of the photoresist on the region for the gate line is greater than a thickness of the photoresist on the region for the thin-film transistor.

FIG. 4A shows the region for the gate line and the region for the thin-film transistor in this embodiment. First of all, photoresists 14 are coated onto the region for the gate line and the region for the thin-film transistor, respectively. Then, a photoetching process is performed so that photoresists are disturbed as shown in FIG. 4A.

S3, etching regions of the overlapped structure where no photoresist 14 is coated, to remove all the regions of the overlapped structure where no photoresist is coated.

Figure 4B:
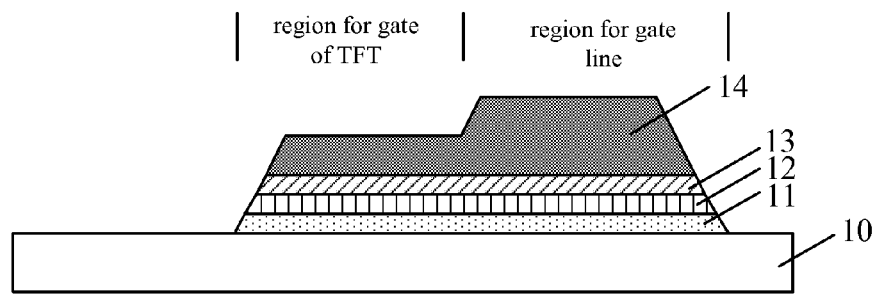

Referring to FIG. 4B, the region for the gate line and the region for the thin-film transistor over the overlapped structure are covered with photoresists. As a result, regions where no photoresist 14 is coated may be etched, in order to remove the rest of the overlapped structure. $H_2O_2$ and HF may be used during the etching, to etch MoW and Cu, respectively.

After the etching, GI and an active layer are deposited, and, corresponding patternings are performed. SD metal is deposited, to form a bottom gate type TFT device.

S4, etching the photoresists, so that the photoresist over the region for the thin-film transistor is completely etched off, to expose the overlapped structure, while the photoresist over the region for the gate line is not completely etched off.

Figure 4C:
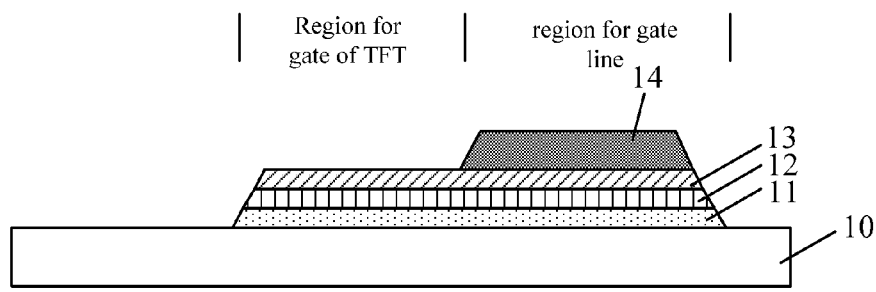
Figure 4D:
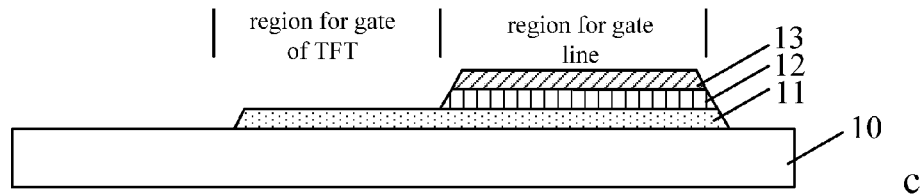

Referring to FIG. 4C, an ashing process is performed. The ashing process is performed on PR by means of O2 with a dry etch apparatus, to etch the photoresists. Since the photoresist 14 on the region for the gate line has a greater thickness, the photoresist 14 of certain thickness will be remained on the region for the gate line after completely removing the photoresist 14 on the region for the TFT by etching.

S5, etching the exposed overlapped structure obtained in the step S4, to remove the second MoW layer and the Cu layer of the exposed overlapped structure so as to expose the first MoW layer.

Since the overlapped structure at the region for the TFT is exposed in the step S4, it continues to perform the etching on the overlapped structure at the region for the TFT while keeping the etching on the photoresist over the region for the gate. Gas $Cl_2$ is employed during the etching. The etching process is controlled so that the overlapped structure at the region for the TFT has the second MoW layer 13 and the Cu layer 12 etched off while remaining the first MoW layer 11, meanwhile the photoresist over the region for the gate line is completely etched off.

S6, manufacturing the thin-film transistor where the exposed first MoW layer obtained in the step S5 is served as the gate layer.

After completion of the step S5, manufacture of the TFT may be made in a conventional manner. For example, a flat structure shown in FIG. 3 is obtained during the formation of the source-drain layer.

Second Embodiment

The second embodiment also relates to construction and manufacturing method for a pixel unit used in an array substrate of a display device. In the pixel unit, a MoW/Cu/MoW overlapped structure is employed for the source-drain line, while a layer of MoW is employed for a source and a drain of the TFT.

Figure 5:
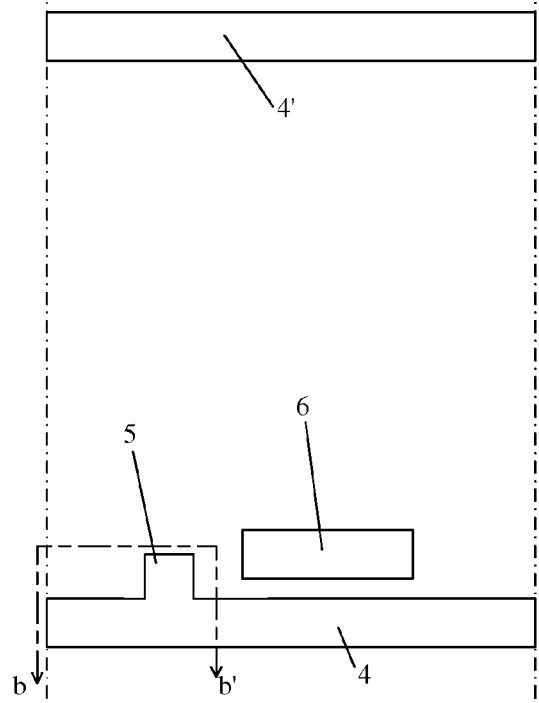
FIG. 5 is a top view of a pixel unit according to a second embodiment of the present invention, when a source-drain line and a source-drain of a TFT are not formed yet.

FIG. 5 is a top view of this embodiment, when a source-drain line and a source-drain of a TFT are not formed yet. As shown in this figure, gate lines have been formed in regions 4, 4' for the gate line and gate of the TFT has been formed in regions 5, 6 for the gate of the TFT, in which the region 5 for the gate of the TFT is a region where a gate of a gate switching TFT is located and the region 6 for the gate of the TFT is a region where a gate of a data driving TFT is located.

In this embodiment, the source-drain line comprises a data line and a VDD line. The date line is used for providing data driving, while the VDD line is used for providing current source line of light to OLED.

Figure 6:
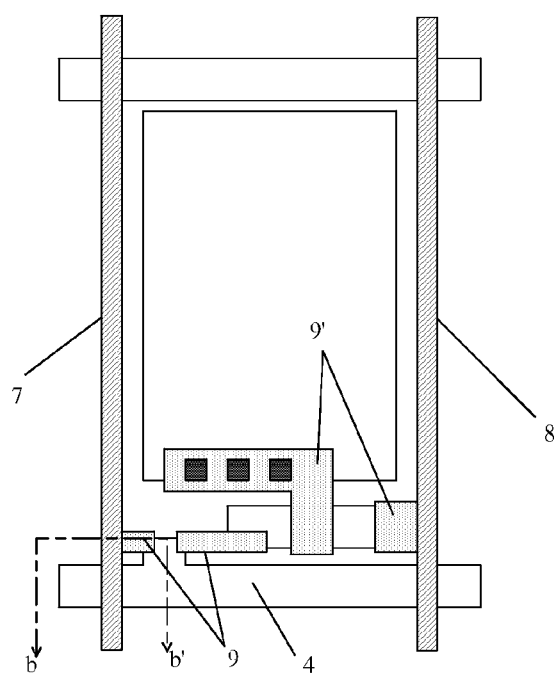
FIG. 6 is a top view of the embodiment shown in FIG. 5, after the source-drain of the TFT and the source-drain line of the pixel unit are formed.

FIG. 6 is a top view of the embodiment shown in FIG. 5, after the source-drain of the TFT and the source-drain line of the pixel unit are formed. Referring to FIG. 6, here, in the pixel unit, the data line is formed in a region 7 for the data line and the VDD line is formed in a region for the VDD line. Meanwhile, the source and the drain of the TFT are formed on regions 9, 9' for the source and the drain of the TFT. The region 9 is a region where a source and a drain of a gate switching TFT is located, and, the region 9' is a region where a source and a drain of a data driving TFT is located.

In this embodiment, material for the source-drain line formed on the regions 7, 8 for the source-drain layer is in an overlapped structure comprising a first MoW layer, a Cu layer and a second MoW layer from bottom to top. And, a source and a drain formed on the region for the source and the drain of the TFT is formed of the first MoW layer.

It should be noted that, the first MoW layer, the Cu layer and the second MoW layer of the second embodiment and those of the first embodiment can be made of the same materials, although they are different in layers.

As to the pixel unit shown in FIG. 6, its formation process will be described with reference to FIG. 7A to FIG. 7D. FIG. 7A to FIG. 7D are schematic diagrams showing a manufacturing process, step by step, along line b-b' in FIG. 5 and FIG. 6. The method comprises the following steps.

Figure 7A:
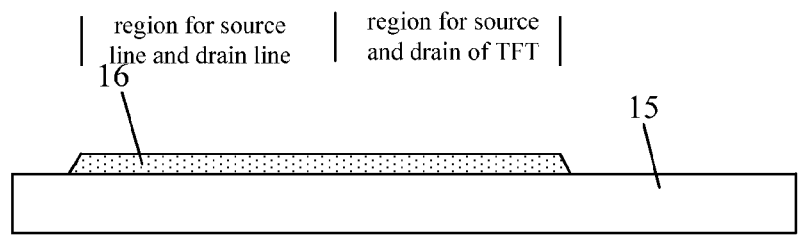
FIG. 7A to FIG. 7D are schematic diagrams showing a manufacturing process, step by step, along line b-b' in FIG. 5 and FIG. 6.

T1, forming a gate layer including the gate line and a gate of the thin-film transistor, a gate stop layer, an active layer and an etching stop layer on a substrate successively. Referring to FIG. 7A, reference sign 15 indicates whole structure including the gate layer, a gate stop layer, an active layer and an etching stop layer formed on the substrate.

T2, forming a first MoW layer over a region for the source-drain line and a region for the source and the drain of the thin-film transistor.

As mentioned above, the source-drain line comprises a data line and a VDD line. In this embodiment, the first MoW layer 16 is formed over both the region for the data line and the region for the VDD line.

T3, coating photoresists onto regions, other than the region for the source-drain line, to form photoresist regions.

Figure 7B:
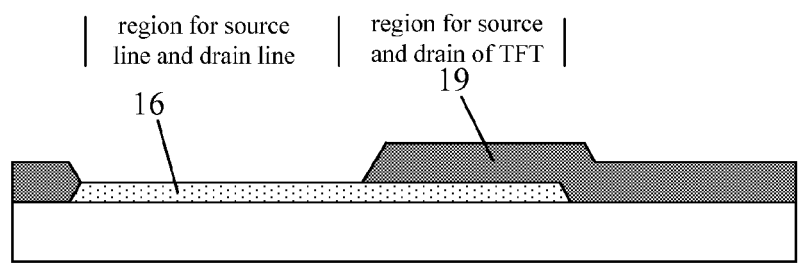

Referring to FIG. 7B, in this step, all the regions, other than the region for the source-drain line, on the whole substrate are coated with photoresists 19.

T4, forming a Cu layer and a second MoW layer over the photoresist regions and the region for the source-drain line successively.

Figure 7C:
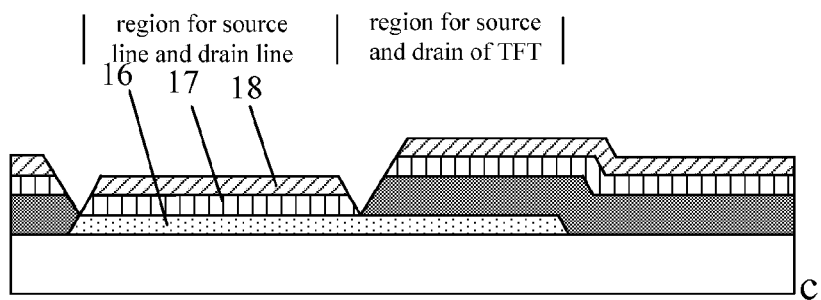

Referring to FIG. 7C, after the step T3, on the whole substrate, the Cu layer 17 and the second MoW layer are formed over the regions coated with photoresists and the regions with no photoresists at the same time. They may be formed by sputtering.

T5, removing the photoresists as well as the Cu layer and the second MoW layer formed thereover, by means of a lift off process, to expose the first MoW layer in the region for the source-drain of the thin-film transistor.

Figure 7D:
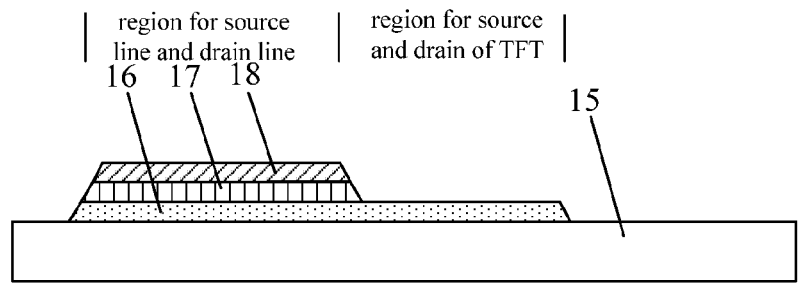

Referring to FIG. 7D, by meand of the lift off process, the first MoW layer 16 on the region for the TFT is exposed.

T6, manufacturing the thin-film transistor where the exposed first MoW layer obtained in the step T5 is served as the source and the drain. Accordingly, the source and the drain of the manufactured TFT includes a MoW layer only and excludes a Cu layer, thereby eliminating adverse effect due to diffusion of Cu towards the oxide active layer, so as to achieve the object of embodiments of the present invention.

Concerning the above, on one hand, in the manufacture of the pixel unit of the array substrate according embodiments of to the present invention, MoW/Cu/MoW is used as material for gate line. In the patterning of the gate of the TFT, the upper MoW layer and the Cu layer of the material for gate of the TFT is etched off by means of a halftone process while remaining the lower MoW layer served as the gate of the TFT, which ensures that no metal Cu is present below the oxide active layer of the TFT, thereby solving the problems of diffusion of Cu towards the oxide active layer of the TFT and relatively great increase of the drain current. On the other hand, in the manufacture of the pixel unit of the array substrate according to embodiments of the present invention, MoW/Cu/MoW is used as the source-drain line. Only the MoW layer is remained over the source-drain of the TFT by means of Lift Off technology, thereby solving the problems of diffusion of Cu towards the active layer of the TFT and achieving high speed of signal transmission.

A further description of objects, technique solutions and advantages of the present invention has been made in conjunction with abovementioned embodiments. It should be understood that the above description is merely used to illustrate specific embodiments of the present invention, but not intended to limit the scope of the present invention. All of changes, equivalent alternatives, improvements, made within principles and spirit of the invention, should be construed to fall within the scope of the present invention.

What is claimed is:

1. A method of manufacturing a pixel unit wherein the method comprises the steps of:
   S1, forming a first MoW layer, a Cu layer and a second MoW layer successively on a substrate, to form an overlapped structure;
   S2, coating photoresists onto a region for a gate line and a region for a thin-film transistor over the overlapped structure, respectively, and, performing a halftone process so that a thickness of the photoresist on the region for the gate line is greater than a thickness of the photoresist on the region for the thin-film transistor;
   S3, etching regions of the overlapped structure where no photoresist is coated, to remove all the regions of the overlapped structure where no photoresist is coated;
   S4, etching the photoresists, so that the photoresist over the region for the thin-film transistor is completely etched off, to expose the overlapped structure, while the photoresist over the region for the gate line is not completely etched off;
   S5, etching the exposed overlapped structure obtained in the step S4, to remove the second MoW layer and the Cu layer of the exposed overlapped structure so as to expose the first MoW layer; and
   S6, manufacturing the thin-film transistor where the exposed first MoW layer obtained in the step S5 is served as the gate layer.

2. The method of manufacturing the pixel unit of claim 1, wherein in the step S6, oxide is served as an organic layer of the thin-film transistor.

3. A method for manufacturing an array substrate, wherein a pixel unit of the array substrate is manufactured by a method for manufacturing a pixel unit of claim 1.

4. A method for manufacturing a display device, wherein an array substrate of the display device is manufactured by a method for manufacturing an array substrate of claim 3.

5. A pixel unit manufactured by the method of claim 1, the pixel unit comprising:
   a gate line, a source-drain line and a thin-film transistor, wherein:
      the gate line is in an overlapped structure comprising a first MoW layer, a Cu layer and a second MoW layer overlapped successively; and
      a gate of the thin-film transistor is formed of the first MoW layer.

6. The pixel unit of claim 5, wherein an active layer of the thin-film transistor is oxide.

7. An array substrate comprising a pixel unit of claim 5.

8. A display device comprising an array substrate of claim 7.

9. A method for manufacturing a pixel unit, the method comprising steps of:
   T1, forming a gate layer including the gate line and a gate of the thin-film transistor, a gate stop layer, an active layer and an etching stop layer on a substrate successively;
   T2, forming a first MoW layer over a region for a source-drain line and a region for a source and a drain of a thin-film transistor;
   T3, coating photoresists onto regions, other than the region for the source-drain line, to form photoresist regions;
   T4, forming a Cu layer and a second MoW layer over the photoresist regions and the region for the source-drain line successively;
   T5, removing the photoresists as well as the Cu layer and the second MoW layer formed thereover, by means of a lift off process, to expose the first MoW layer in the region for the source-drain of the thin-film transistor; and
   T6, manufacturing the thin-film transistor where the exposed first MoW layer obtained in the step T5 is served as the source and the drain.

10. The method for manufacturing a pixel unit of claim 9, wherein the source-drain line comprises at least one of a data line and a VDD line.

11. The method for manufacturing a pixel unit of claim 9, wherein in the step T1, oxide is used as an active layer of the thin-film transistor.

12. A method for manufacturing an array substrate, wherein a pixel unit of the array substrate is manufactured by a method for manufacturing a pixel unit of claim 9.

13. A method for manufacturing a display device, wherein an array substrate of the display device is manufactured by a method for manufacturing an array substrate of claim 12.

14. A pixel unit manufactured by the method of claim 9, the pixel unit comprising a gate line, a thin-film transistor and a source-drain line connected to a source and a drain of the thin-film transistor, wherein:
   the source-drain line is in an overlapped structure comprising a first MoW layer, a Cu layer and a second MoW layer overlapped successively; and
   the source and the drain of the thin-film transistor are formed of the first MoW layer.

15. The pixel unit of claim 14, wherein the source-drain line comprises at least one of a data line and a VDD line.

16. The pixel unit of claim 14, wherein an active layer of the thin-film transistor is oxide.

17. An array substrate comprising a pixel unit of claim 14.

18. A display device comprising an array substrate of claim 17.

19. A method of manufacturing a pixel unit, wherein the method comprises the steps of:
   S1, forming a first MoW layer, a Cu layer and a second MoW layer successively on a substrate, to form an overlapped structure;
   S2, coating photoresists onto a region for a gate line and a region for a thin-film transistor over the overlapped structure, respectively, and, performing a halftone process so that a thickness of the photoresist on the region for the gate line is greater than a thickness of the photoresist on the region for the thin-film transistor;
   S3, etching regions of the overlapped structure where no photoresist is coated, to remove all the regions of the overlapped structure where no photoresist is coated;
   S4, etching the photoresists, so that the photoresist over the region for the thin-film transistor is completely etched off, to expose the overlapped structure, while the photoresist over the region for the gate line is not completely etched off;
   S5, etching the exposed overlapped structure obtained in the step S4, to remove the second MoW layer and the Cu layer of the exposed overlapped structure so as to expose the first MoW layer; and
   S6, manufacturing the thin-film transistor where the exposed first MoW layer obtained in the step S5 is served as the gate layer;
   or the method comprises the steps of:

T1, forming a gate layer including the gate line and a gate of the thin-film transistor, a gate stop layer, an active layer and an etching stop layer on a substrate successively;

T2, forming a first MoW layer over a region for a source-drain line and a region for a source and a drain of a thin-film transistor;

T3, coating photoresists onto regions, other than the region for the source-drain line, to form photoresist regions;

T4, forming a Cu layer and a second MoW layer over the photoresist regions and the region for the source-drain line successively;

T5, removing the photoresists as well as the Cu layer and the second MoW layer formed thereover, by means of a lift off process, to expose the first MoW layer in the region for the source-drain of the thin-film transistor; and T6, manufacturing the thin-film transistor where the exposed first MoW layer obtained in the step T5 is served as the source and the drain.

* * * * *